(12) United States Patent
Chang et al.

(10) Patent No.: US 10,347,306 B2
(45) Date of Patent: Jul. 9, 2019

(54) SELF-OPTIMIZED POWER MANAGEMENT FOR DDR-COMPATIBLE MEMORY SYSTEMS

(71) Applicant: SAMSUNG ELECTRONICS CO., LTD., Suwon-si, Gyeonggi-do (KR)

(72) Inventors: Mu-Tien Chang, Santa Clara, CA (US); Dimin Niu, Sunnyvale, CA (US); Hongzhong Zheng, Los Gatos, CA (US); Craig Hanson, Champlin, MN (US); Sun Young Lim, Hwasung (KR); Indong Kim, Hwasung (KR); Jangseok Choi, Hwasung (KR)

(73) Assignee: Samsung Electronics Co., Ltd. (KR)

( * ) Notice: Subject to any disclaimer, the term of this patent is extended or adjusted under 35 U.S.C. 154(b) by 184 days.

(21) Appl. No.: 15/231,629

(22) Filed: Aug. 8, 2016

(65) Prior Publication Data

US 2017/0365305 A1 Dec. 21, 2017

Related U.S. Application Data

(60) Provisional application No. 62/352,991, filed on Jun. 21, 2016.

(51) Int. Cl.
| | |
|---|---|
| *G06F 1/32* | (2019.01) |
| *G06F 1/26* | (2006.01) |
| *G11C 7/10* | (2006.01) |
| *G06F 1/3234* | (2019.01) |
| *G11C 5/04* | (2006.01) |
| *G11C 7/22* | (2006.01) |
| *G06F 1/3287* | (2019.01) |
| *G11C 5/14* | (2006.01) |
| *G11C 11/4074* | (2006.01) |

(52) U.S. Cl.
CPC .............. *G11C 7/1072* (2013.01); *G06F 1/32* (2013.01); *G06F 1/325* (2013.01); *G06F 1/3234* (2013.01); *G06F 1/3275* (2013.01); *G11C 5/04* (2013.01); *G11C 7/22* (2013.01); *G06F 1/3287* (2013.01); *G11C 5/148* (2013.01); *G11C 7/10* (2013.01); *G11C 11/4074* (2013.01); *G11C 2207/2227* (2013.01); *Y02D 10/14* (2018.01); *Y02D 50/20* (2018.01)

(58) Field of Classification Search
None
See application file for complete search history.

(56) References Cited

U.S. PATENT DOCUMENTS

| | | | |
|---|---|---|---|
| 8,339,891 B2 | 12/2012 | Arntzen et al. | |
| 8,611,170 B2 | 12/2013 | Kam et al. | |
| 8,824,222 B2 | 9/2014 | Ware et al. | |
| 8,879,346 B2 | 11/2014 | Kam et al. | |
| 2005/0120069 A1* | 6/2005 | Shankar | 708/620 |
| 2007/0006000 A1* | 1/2007 | Jain et al. | 713/300 |

(Continued)

*Primary Examiner* — Tanh Q Nguyen
(74) *Attorney, Agent, or Firm* — Innovation Counsel LLP

(57) ABSTRACT

A memory module includes a plurality of memory components, an in-memory power manager, and an interface to a host computer over a memory bus. The in-memory power manager is configured to control a transition of a power state of the memory module. The transition of the power state of the memory module includes a direct transition from a low power down state to a maximum power down state.

20 Claims, 8 Drawing Sheets

(56) References Cited

U.S. PATENT DOCUMENTS

| | | | |
|---|---|---|---|
| 2008/0294928 A1* | 11/2008 | Jain | G06F 1/3225 |
| | | | 713/600 |
| 2016/0217848 A1* | 7/2016 | Ishizu et al. | G11C 11/419 |
| 2017/0249991 A1* | 8/2017 | Han et al. | G11C 14/0009 |
| 2017/0255575 A1* | 9/2017 | Niu et al. | G06F 13/1673 |
| 2017/0365305 A1* | 12/2017 | Chang | G11C 7/1072 |

* cited by examiner

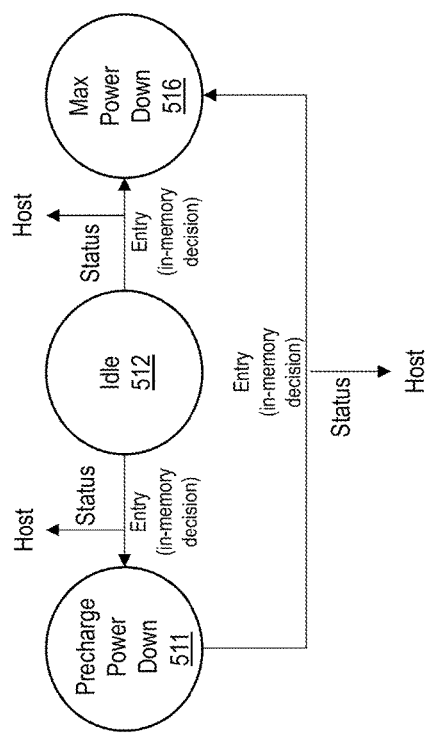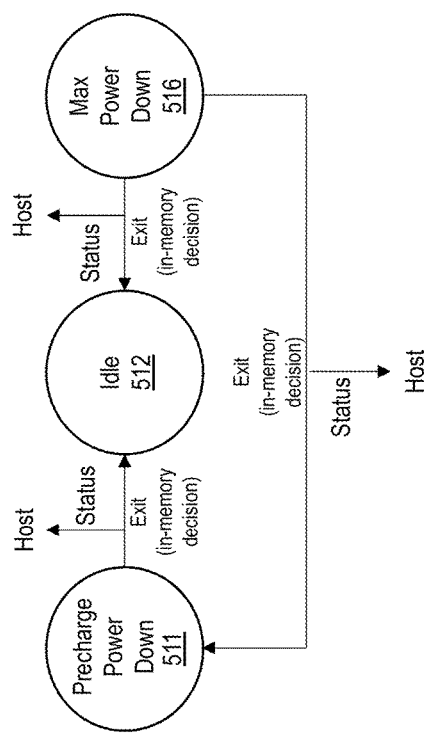

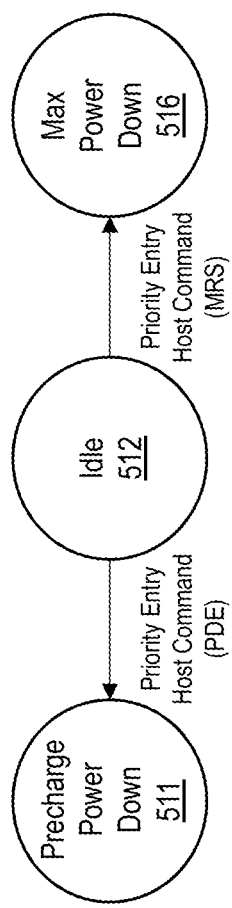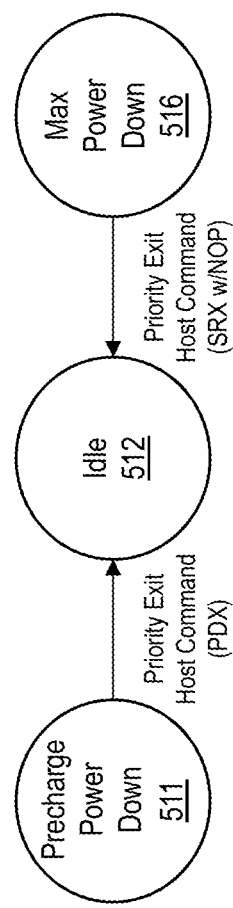
FIG. 5C
FIG. 5D

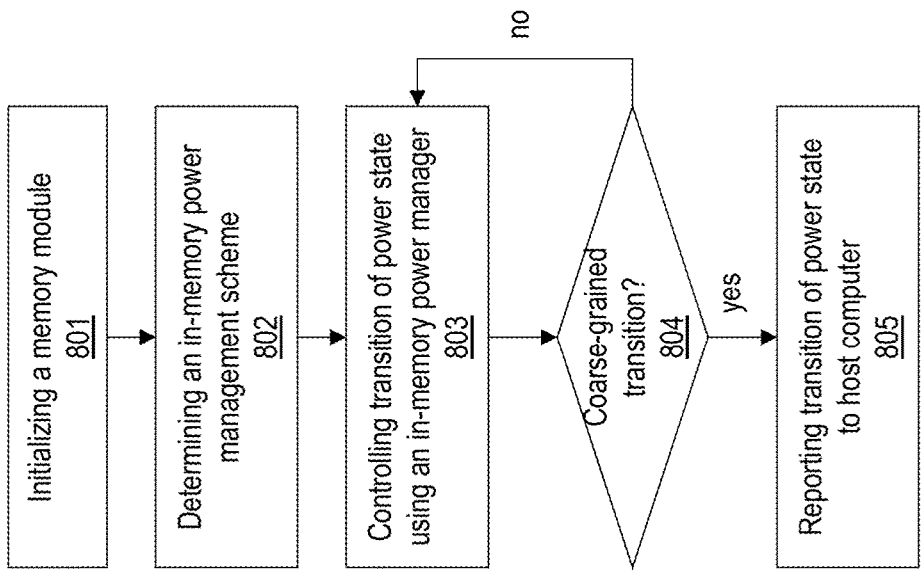

SELF-OPTIMIZED POWER MANAGEMENT FOR DDR-COMPATIBLE MEMORY SYSTEMS

CROSS-REFERENCE TO RELATED APPLICATION(S)

This application claims the benefits of and priority to U.S. Provisional Patent Application Ser. No. 62/352,991 filed Jun. 21, 2016, the disclosure of which is incorporated herein by reference in its entirety.

TECHNICAL FIELD

The present disclosure relates generally to power management for memory systems, more particularly, to self-optimized power management for double data rate (DDR)-compatible memory systems.

BACKGROUND

The Joint Electron Device Engineering Council (JEDEC) Solid State Technology Association specifies the standards for double data rate (DDR) synchronous dynamic random-access memories (SDRAMs) and definitions of the signaling protocol for the exchange of data between a memory controller of a host computer and a DDR-compatible memory module. The fourth-generation DDR (DDR4) SDRAM provides a maximum power-saving mode to improve energy efficiency compared to earlier generation DDR memories such as third-generation DDR (DDR3) SDRAM.

The DDR4 memory has primarily three power states, namely, a normal power state, a low power state, and a deep low power state. FIG. 1 is a simplified power state diagram of a DDR4 memory. The normal power state 101 corresponds to a power state of the DDR memory under normal operations. The low power state 111 is used to transition the power state of the DDR4 memory from an idle mode (i.e., the normal power state) to a precharge power down mode or an active power down mode. The deep low power state 121 is used to transition the power state of the DDR4 memory from the idle mode to a self-refresh mode or a max-power down mode. The low power state 111 has faster entries and exits, and the deep low power state 121 has slower entries and exits. Typically, a memory controller of a host computer manages the transition between power states using DDR4 commands and specified timings.

FIG. 2 shows a detailed power state diagram for a DDR4 memory. The idle state 212 is defined as a state where all banks of the DDR memory are closed, no data bursts are in progress, the clock enable (CKE) is high, and all timings from previous operations are satisfied. During a power-down, if all banks of the DDR memory are closed after any in-progress commands are completed, the DDR4 memory enters the precharge power-down mode 211 by an enter power-down (PDE) command and exits the precharge power-down mode 211 by an exit power-down (PDX) command. Both the PDE command and the PDX command are issued by a memory controller of a host computer.

The maximum power down mode 216 provides the lowest power mode. The DDR memory can enter the maximum power-down mode 216 from the idle state 212 via a mode register set (MRS) command and exit the maximum power-down mode 216 via a self-refresh exit (SRX) command followed by a no operation (NOP) command. Both the MRS command and the SRX command with NOP are issued by the memory controller of the host computer. In the maximum power down mode 216, the DDR4 memory may still maintain data retention but may not respond to any external host command except a maximum power saving mode exit command (i.e., the SRX command with NOP). Since the DDR4 memory does not respond to any external host command in the maximum power down mode 216, the max power down mode 216 is also referred to as a hibernate mode.

The DDR4 memory periodically refreshes a whole memory rank by entering the self-refresh mode 215 via a refresh command. For example, the DDR4 memory can enter the self-refresh mode 215 from the idle state 212 via a self-refresh entry (SRE) and exit to the idle mode 212 via a self-refresh exit (SRX). Both the SRE command and the SRX command are issued by the memory controller of the host computer. The self-refresh mode 215 can be entered only from the idle state 212.

After receiving a bank activate command prior to issuing a read or write command, the DDR4 memory enters the bank active mode 217 via transitioning from the idle state 212 through an activating state 213. A precharge command is used to deactivate the open row in a particular bank or the open row in all banks from the bank active state 217. Once a bank is precharged, the DDR4 memory is returned to the idle state 212 through a precharging state 214. The DDR4 memory must be reactivated prior to a read or write commands being issued to the bank. According to the DDR4 specification, a read request includes an ACT command for activating the bank and loading the row to a row buffer and a RD command following the ACT command for reading a column from the row buffer. To access another row, the memory controller needs to send a PRE command to precharge the bank for restoring the bank. Until a PRE command is received, the bank can stay in the bank active mode 217 even when the memory controller does not service any column reads or writes. When the memory module is in the bank active mode 217 having at least one activated bank but not servicing any request, the memory controller can issue a PDE command to make the bank enter the active power-down mode 218 to power down the bank.

The current DDR4 power schema has certain limitations. For example, there are only three primary power states, i.e., the normal power state, the low power state, and the deep low power state. A direct transition between the low power state and the deep low power state is not available as the transition between the low power state and the deep low power state must go through the normal power state. Furthermore, the entire process for power state transition is managed by a memory controller of a host computer.

SUMMARY

According to one embodiment, a memory module includes a plurality of memory components, an in-memory power manager, and an interface to a host computer over a memory bus. The in-memory power manager is configured to control a transition of a power state of the memory module. The transition of the power state of the memory module includes a direct transition from a low power down state to a maximum power down state.

According to another embodiment, a method for providing an in-memory power transition includes: providing an in-memory power manager in a memory module, wherein the memory module is coupled to a host computer over a memory bus; determining an in-memory power management scheme at initialization of the memory module; and controlling a transition of a power state of the memory module using the in-memory power manager. The transition of the power state of the memory module includes a direct transition from a low power down state to a maximum power down state.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

FIGS. 5A-5D show detailed power state diagrams of a memory module, according to some embodiments;

FIG. 8 is a flow chart of an example in-memory power transition process, according to one embodiment.

Figure 2:
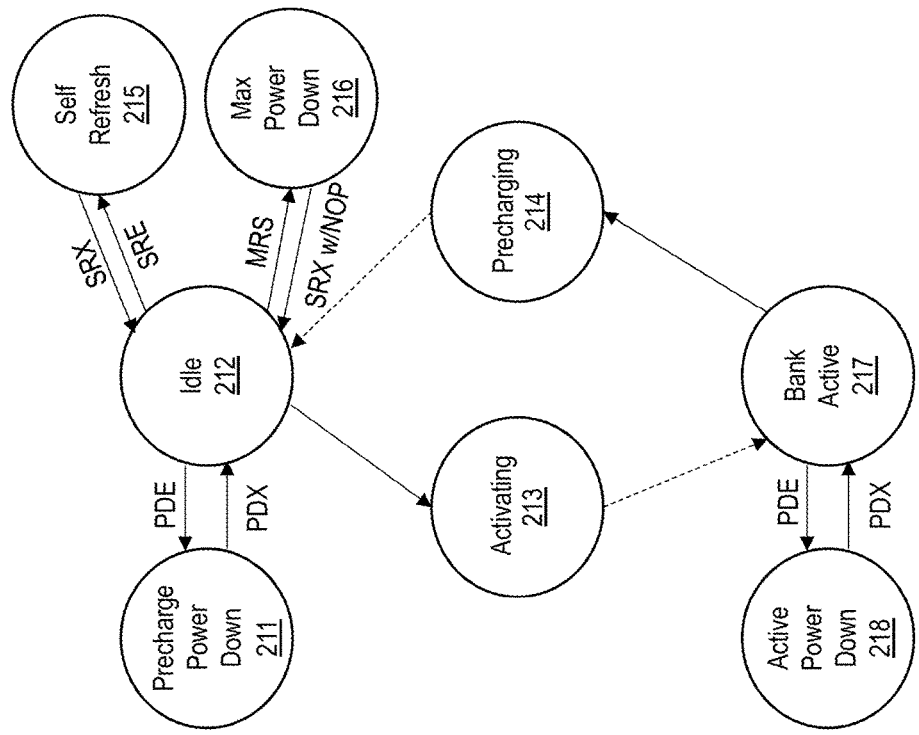
FIG. 2 shows a detailed power state diagram for a DDR4 memory.
Figure 1:
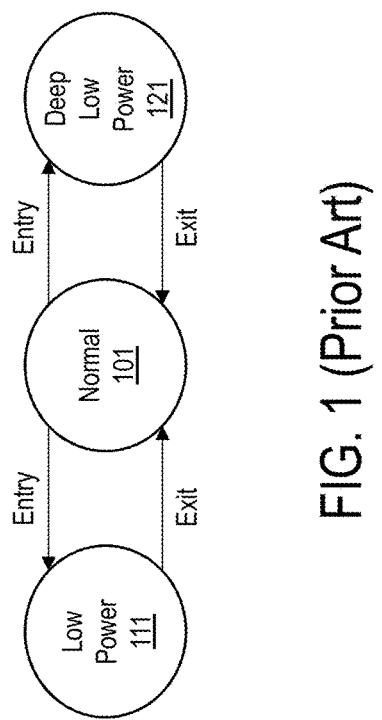
FIG. 1 is a simplified power state diagram of a DDR4 memory.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide self-optimized power management for DDR-compatible memory systems. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed above in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms presented herein are not inherently related to any particular computer or other apparatus. Various general-purpose systems, computer servers, or personal computers may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the disclosure as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure describes a fine-grained power control mechanism for DDR-compatible memory systems. The power control mechanism can be governed by a memory module itself allowing for direct transitioning between any power states. In one embodiment, the present power control mechanism is DDR4 compatible. The DDR4-compatible memory module is capable of sending a power state signal to a memory controller of a host computer using one or more repurposed pins on the memory bus.

Figure 3:
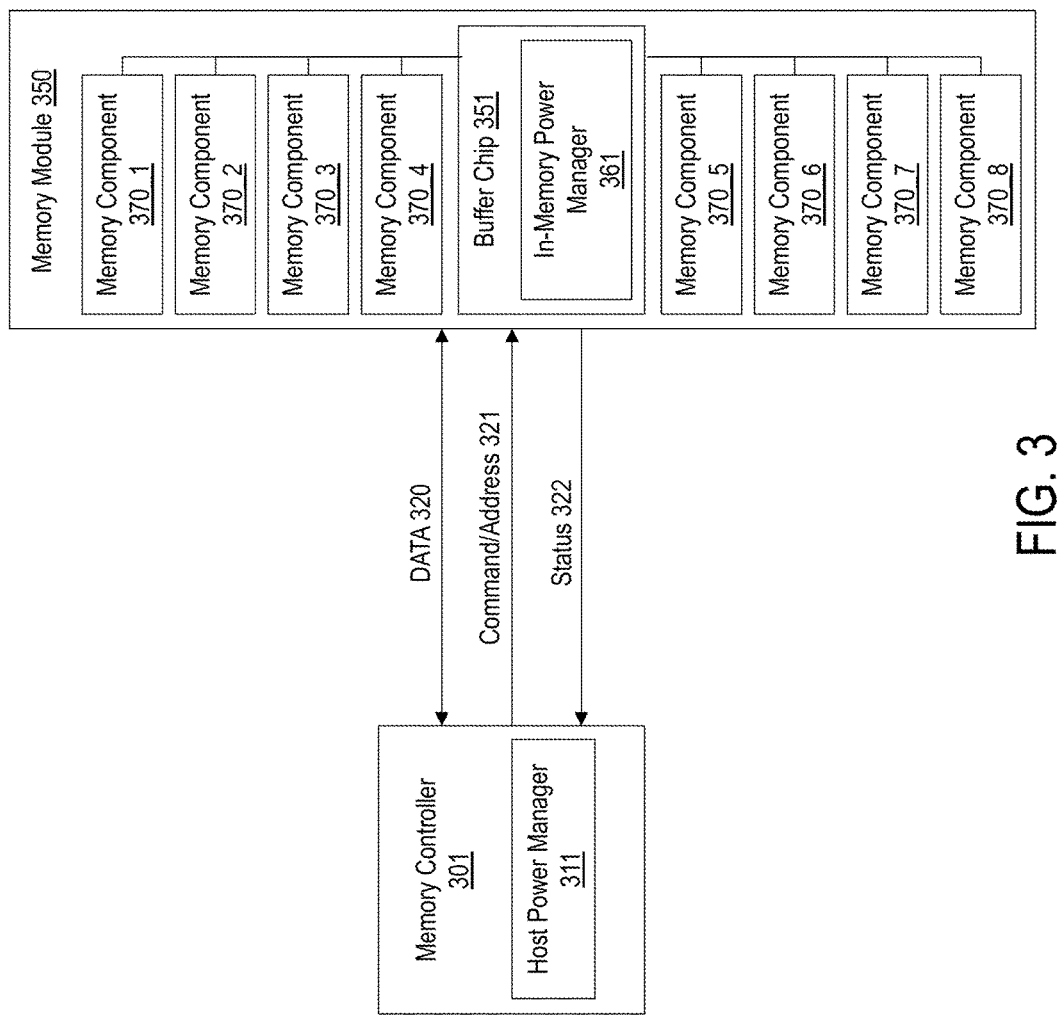
FIG. 3 illustrates a schematic diagram of an example memory system, according to one embodiment.

FIG. 3 illustrates a schematic diagram of an example memory system, according to one embodiment. A memory controller 301 of a host computer (not shown) can control a memory module 350 via a command/address bus 321. Data 320 is transferred between the memory controller 301 and the memory module 350 over the data (DQ) bus. According to one embodiment, the memory module 350 can report a status signal (e.g., a power status signal) to the memory controller 301. In one embodiment, the memory module 350 may use one or more repurposed DDR4 pins for sending the status signal to the memory controller 301. According to another embodiment, the memory module 350 can send a status signal to get the attention from the host computer. In this case, the status signal may not contain any power status information. Instead, the status signal can be an indicator indicating that there is something for the host computer to be aware of. After receiving the status signal, the host computer responds accordingly. For example, the host computer can send a command to read data from the memory module 350. In this case, the status can be transferred over the DQ bus.

According to one embodiment, the memory module 350 has a buffer chip 351, and the buffer chip 351 includes the in-memory power manager 361. The in-memory power manager 361 is configured to make decisions on its own to manage the power state of its memory components 370, and report the power status back to the memory controller 301 using the command/address bus 321, the DQ bus, and/or the status signal 322. A host power manager 311 of the memory controller 301 can optionally manage the power state of the memory module 350 (and any other DDR-compatible memory devices connected to the host computer over a memory bus) by bypassing or overriding power states that is decided by the in-memory power manager 361. The host control by the host power manager 311 can be enabled/disabled, or otherwise controlled by a user at initialization.

Figure 4:
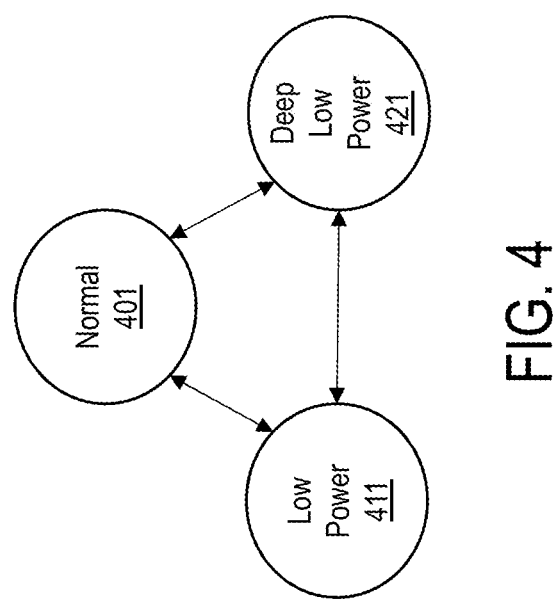
FIG. 4 is a simplified power state diagram of a memory module, according to one embodiment.

According to one embodiment, the memory module 350 can enable a coarse-grained level of power control. FIG. 4 is a simplified power state diagram of a memory module, according to one embodiment. The power control by the memory module (e.g., memory module 350 of FIG. 3) can support the coarse-grained power control that is similar to a traditional host-controlled power control including a transition between a normal state 401 and a low power down state 411, and a transition between the normal state 401 and a deep low power down state 421. The low power down state 411 may include the precharge power down state 511 shown in FIGS. 5A-5D, and the precharge power down state 611 as well as the active power down state 618 shown in FIG. 6. The deep low power down state 421 may include the maximum power down state 516 shown in FIGS. 5A-5D and the maximum power down state 616 shown in FIG. 6.

According to one embodiment, the memory module 350 can enable direct transitions between the low power state 411 and the maximum power down state 421. The in-memory power manager (e.g., the in-memory power manager 361 of FIG. 3) of the memory module can control the entry to and exit from various coarse-grained power states including the normal state 401, the low power state 411, and the maximum power down state 421.

FIGS. 5A-5D show detailed power state diagrams of a memory module, according to some embodiments. The memory module can be in one of the three power states, namely, an idle state 512, a precharge power down state 511, and a maximum power down state 516. Referring to FIG. 5A, the in-memory power manager can transition the power state of the memory module from the idle state 512 to the precharge power down state 511, and from the idle state 512 to the maximum power down state 516. In addition, the in-memory power manager can transition the power state of the memory module from the precharge power down state 511 to the maximum power down state 516. The entry from the idle state 512 to either the precharge power down state 511 or the maximum power down state 516, or from the precharge power down state 511 to the maximum power down state 516 can be determined by the in-memory power manager. When entering, the in-memory power manager can report the status of the memory module to the memory controller of the host computer via a reporting mechanism explained with reference to FIG. 3.

Referring to FIG. 5B, the in-memory power manager can transition the power state of the memory module from the precharge power down state 511 to the idle state 512, and from the maximum power down state 516 to the idle state 512. In addition, the in-memory power manager can transition the power state of the memory module from the maximum power down state 516 to the precharge power down state 511. The exit from either the precharge power down state 511 or the maximum power down state 516 to the idle state 512, or from the maximum power down state 516 to the precharge power down state 511 can be determined by the in-memory power manager. When exiting, the in-memory power manager can report the status of the memory module to the memory controller of the host computer via a reporting mechanism explained with reference to FIG. 3.

According to one embodiment, the memory controller of a host computer can provide host commands for priority entry and exit that can override an in-memory decision made by the in-memory power manager. Based on the status reported by the in-memory power manager, the memory controller of the host computer can determine to nullify the transition of the power state or override the transition of the power state by issuing a host-issued priority power command subsequently.

FIG. 5C shows a priority entry from the idle state 512 to either the precharge power down state 511 or the maximum power down state 516. The entry from the idle state 512 to the precharge power down state 511 is enabled by a power-down (PDE) host command. The entry from the idle state 512 to the maximum power down state 516 is enabled by a mode register set (MRS) host command.

FIG. 5D shows a priority exit from either the precharge power down state 511 or the maximum power down state 516 to the idle state 512. The exit from the precharge power down state 511 to the idle state 512 is enabled by an exit power-down (PDX) host command. The exit from the maximum power down state 516 to the idle state 512 is enabled by a self-refresh exit (SRX) host command followed by a no operation (NOP) command.

Figure 6:
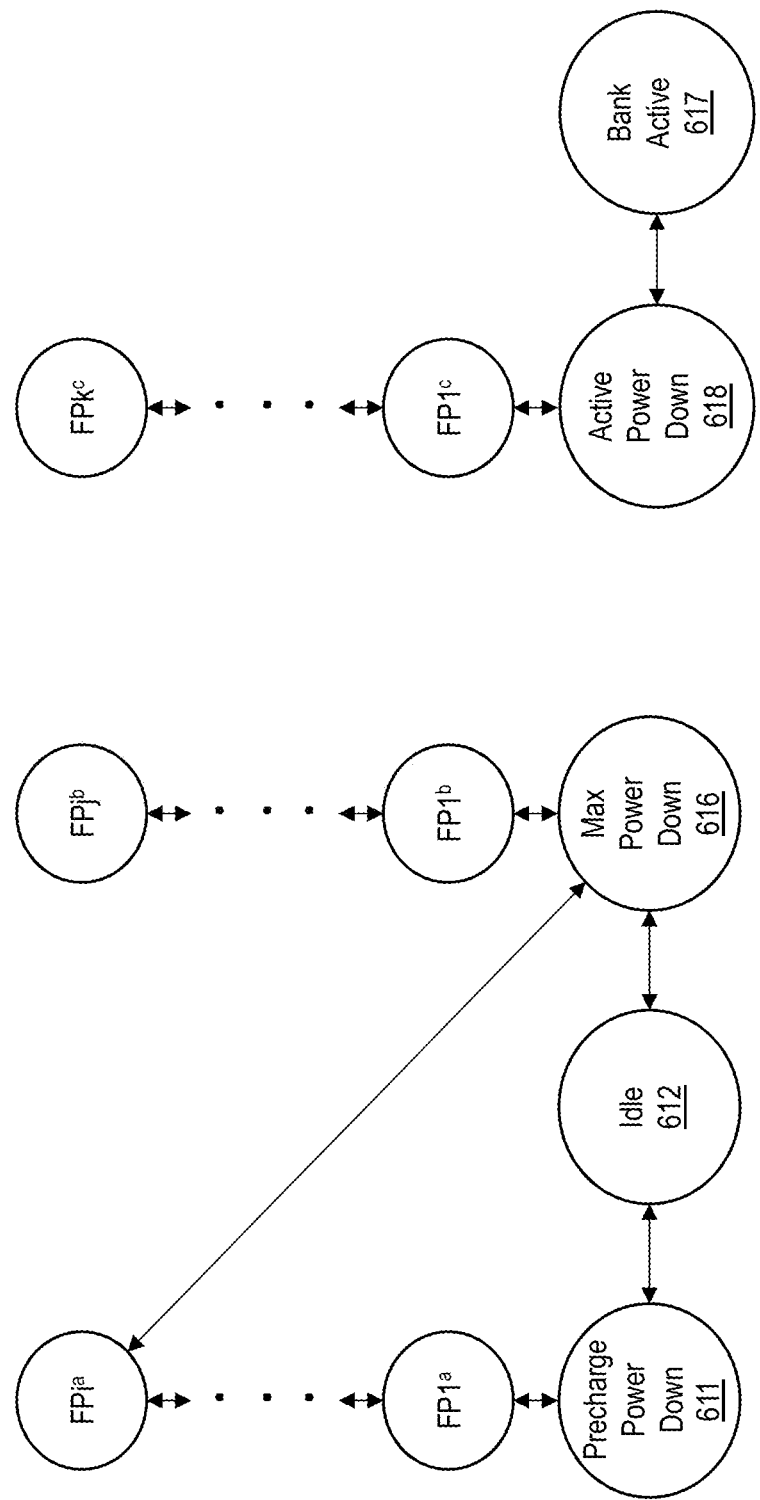
FIG. 6 shows an example of fine-grained power states of a memory module, according to one embodiment.

According to one embodiment, the memory module 350 can have a plurality of fine-grained power states and control its own power states on a fine-grained level. FIG. 6 shows an example of fine-grained power states of a memory module, according to one embodiment. Within each coarse-grained state, the memory can define a number of internal fine-grained states. For example, the precharge power down state 611 of the memory module can have i fine-grained power states, $FP1^a$-$FPi^a$. The maximum power down state 616 of the memory module can have j fine-grained power states, $FP1^a$-$FPj^a$. The active power down state 618 of the memory module can have k power states, $FP1^a$-$FPk^a$.

The present in-memory power manager can manage the transitioning from one fine-grained power state to another fine-grained power state. In one embodiment, the transition between fine-grained power states within a specific coarse-grained power state occurs subsequently such that a fine-grained power state can transition to another fine-grained power state by going through a series of power transitions via those fine-grained power states in between. In another embodiment, the transition between two fine-grained power states in a specific coarse-grained power state can occur without going through intermediate transitions through the fine-grained power states in between.

According to one embodiment, the memory module does not notify the host computer regarding power state changes between fine-grained power states as long as they are within the current coarse-grained state. The transition between fine-grained power states within a specific coarse-grained power state cannot cause a transition to another coarse-grained power state without reporting the transition to the new coarse-grained state. However, the memory module can report to the host computer when transitioning between coarse-grained power states. For example, the memory module reports to the host computer when transitioning from the fined-grained power state $FPi^a$ of the precharge power down state 611 to the maximum power down state 616. Once the memory module enters the maximum power down state 616, the in-memory power manager can transition to any of the fine-grained maximum power down states $FP1^a$-$FPj^a$ without reporting to the host computer. When the in-memory power manager determines to exit the maximum power down state 616, the in-memory power manager reports to the host computer and transitions the power state of the memory module from the maximum power down state 616 back to the fined-grained power state $FPi^a$ of the precharge power down state 611. In one embodiment, when exiting the maximum power down state 616, the in-memory power manager transitions to another fine-grained power down state (e.g., $FP1^1$) other than the fine-grained power down state (e.g., $FP1^a$) of the precharge power down state 611 that the maximum power down state 616 has entered from.

Figure 7:
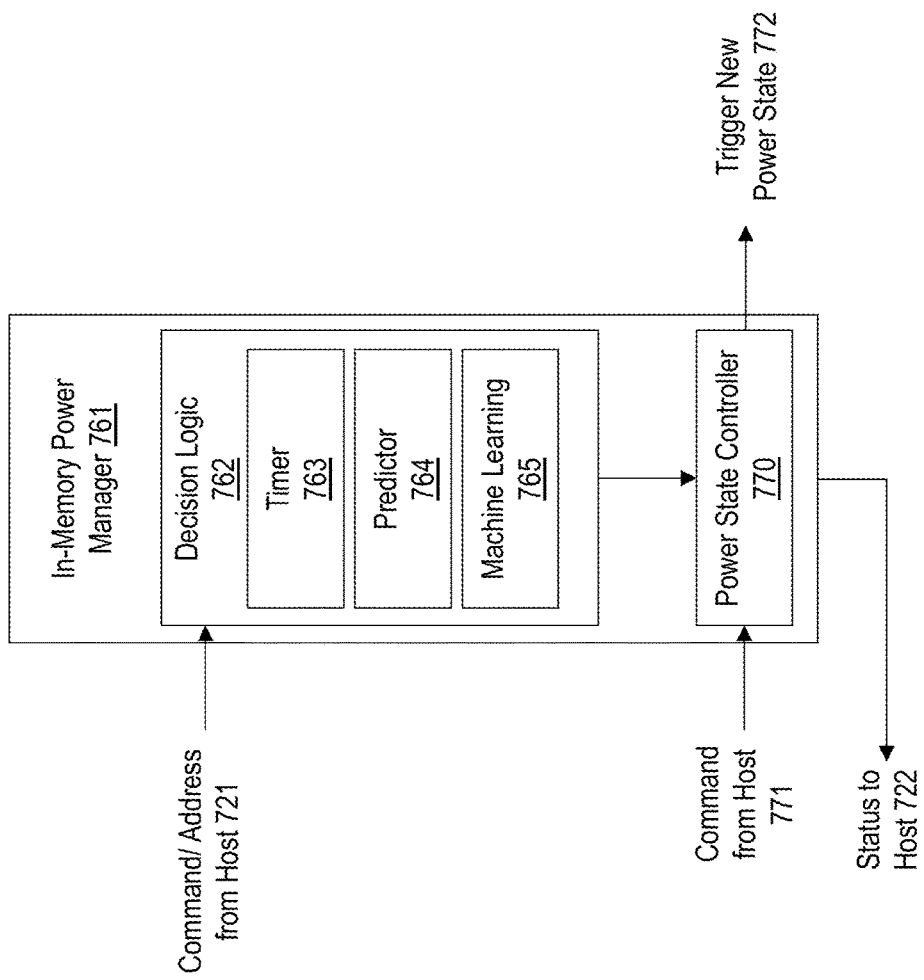
FIG. 7 shows a schematic diagram of an example in-memory power manager, according to one embodiment.

FIG. 7 shows a schematic diagram of an example in-memory power manager, according to one embodiment. The in-memory power manager 761 includes an in-memory decision logic 762 and a power state controller 770. The in-memory decision logic 762 can include one or more of a timer 763, a predictor 764, and a machine learning algorithm 765 and can instruct the power state controller 770 when to change its own power state and which power state to transition to. The power state controller 770 determines the new power state 722 based on the information provided by the in-memory decision logic 762. The power state controller 770 may further refer to the priority power command 771 received by the host computer, for example, priority host commands such as PDE, PDX, MRS, and SRX with NOP as shown in FIGS. 5C and 5D. According to one embodiment, the power state controller 770 maintains a power state table for the memory module, controls a power state transition flow, and enacts a power state change based on the in-memory decision logic 762 and/or the priority power command 771 received from the host computer. Table 1 shows an example of a power state table, according to one embodiment.

TABLE 1 power state table

| Power State | Operational State | Next Allowable States | Entry Latency | Exit Latency |
|---|---|---|---|---|
| 1 | yes | 0, 2 | 10 ns | 10 ns |
| ... | ... | ... | ... | ... |

The timer 763 of the in-memory decision logic 762 can provide temporal information for power transition times using static or dynamic time limits. The predictor 764 of the in-memory decision logic 762 can provide history-based activity predictors. The predictor 764 can also dynamically change timer 763. The machine learning algorithm 765 can learn to optimize power states of the memory module based on self-training, training examples, and/or trained data received from the host computer or another memory module. The training data may be received from the host computer during an initialization of the memory module. The machine learning algorithm 765 may modify the predictor 764 or the timer 763 based on the learning.

The host computer and the memory module can coordinate transition between coarse-grained power states. In general, the host control of power states on the memory module override the in-memory control. The in-memory power manager 761 is capable of reporting its own power state to the host computer via a status signal 722. The status signal 722 may be sent from the memory module to the host computer via one or more dedicated or repurposed pins over the memory bus. The host computer can be configured at initialization to receive and utilize the status signal 722 from the memory module.

Examples of the dedicated or repurposed feedback pins include, but are not limited to, DQ, OD[1], CKE[1], CS[1:3], CK_N[1], CK_P[1], RFUs, and ALERT_n of a DDR memory bus. These dedicated or repurposed pins may be used to exchange the status signal 722 as well as the priority power command 771.

According to one embodiment, the in-memory decision logic 762 is programmable by a user. The memory module can be configured during the initialization to determine a self-power management scheme allowable for the memory module. For example, the memory module can be configured to enable self-governing only at a coarse level. In another example, the memory module can be configured to enable self-governing at the fine-grained power level.

FIG. 8 is a flow chart of an example in-memory power transition process, according to one embodiment. A memory module that is DDR-compatible is initialized (step 801). During the initialization, a memory controller of a host computer determines an in-memory power management scheme of the memory module (step 802). The in-memory power management scheme of the memory module may be determined based on the type of the memory module and the negotiation between the memory controller and an in-memory power manager of the memory module during the initialization. In addition, the in-memory power management scheme can enable/disable, or allow a host control by a host power manager during a runtime. For example, the memory module is allowed or disallowed to transition between fine-grained power states based on the employed in-memory power management scheme. The in-memory power manager of the memory module can transition the power state of the memory module by an internal logic and/or a host power command (step 803). If the transition of the power state is a coarse-grained power transition (step 804), the in-memory power manager reports the change of the power state to the host computer (step 805). Otherwise, for transitions between fine-grained power states, the in-memory power manager does not report the power state change to the host computer. The process of changing the power state of the memory module continues to optimize the power consumption of the memory module without relying on a host power command received from the host computer.

According to one embodiment, the in-memory power manager can optimize the power state of the memory module in a fine-grained power states within the power states defined by the DDR standard such as the normal state 401, the low power down state 411, and the deep low power down state 421. For example, the present memory system can be implemented in a datacenter. During low memory traffic hours (e.g., early morning hours), the in-memory power manager may detect that there is no or few memory requests. The in-memory power manager can then decide to make the memory module to enter a low power state. When in-memory power manager detects more memory traffics (e.g., during normal morning hours), the in-memory power manage may detect that the memory demand is increasing and exit the lower power state, so that it can respond to memory requests quickly.

According to one embodiment, a memory module includes a plurality of memory components, an in-memory power manager, and an interface to a host computer over a memory bus. The in-memory power manager is configured to control a transition of a power state of the memory module. The transition of the power state of the memory module includes a direct transition from a low power down state to a maximum power down state.

The memory module may be a double data rate (DDR)-compatible memory module.

The host computer may be configured to provide a host power command that overrides the transition of the power state of the memory module by the in-memory power manager.

The memory bus may include one or more repurposed pins for sending a status signal to the host computer.

Each of the low power down state and the maximum power down state may have a plurality fine-grained power states, and the in-memory power manager may not send the status signal for the transition of the power state of the memory module between the plurality of fine-grained power states.

The in-memory power manager may include an in-memory decision logic for determining a new power state and a time to transition to the new power state. The in-memory decision logic may include one or more of a timer, a predictor, and a machine-learning algorithm.

The timer may be configured to provide temporal information for power transition times using static or dynamic time limits.

The predictor may be configured to provide history-based activity predictors for the transition of the power state of the memory module.

The machine learning algorithm may be configured to learn optimize power states based on one or more of self-training, training examples, and trained data received from the host computer or another memory module.

The in-memory power manager may further include a power state controller that is configured to transition the power state of the memory module based on one or more of a decision provided by the in-memory decision logic and a host power command received from the host computer.

According to another embodiment, a method for providing an in-memory power transition includes: providing an in-memory power manager in a memory module, wherein the memory module is coupled to a host computer over a memory bus; determining an in-memory power management scheme at initialization of the memory module; and controlling a transition of a power state of the memory module using the in-memory power manager. The transition of the power state of the memory module includes a direct transition from a low power down state to a maximum power down state.

The memory module may be a double data rate (DDR)-compatible memory module.

The method may further include providing a host power command from the host computer that overrides the transition of the power state of the memory module by the in-memory power manager.

The method may further include sending a status signal to the host computer using one or more repurposed pins on a memory bus.

Each of the low power down state and the maximum power down state may have a plurality fine-grained power states, and the method may further include allowing the transition of the power state of the memory module between the plurality of fine-grained power states without sending the status signal to the host computer.

The in-memory power manager may include an in-memory decision logic for determining a new power state and a time to transition to the new power state.

The method may further include providing temporal information for power transition times using static or dynamic time limits using a timer of the in-memory decision logic.

The method may further include providing history-based activity predictors for the transition of the power state of the memory module using a predictor of the in-memory decision logic.

The method may further include learning optimize power states based on one or more of self-training, training examples, and trained data received from the host computer or another memory module.

The method may further include transitioning the power state of the memory module based on one or more of a decision provided by the in-memory decision logic and a host power command received from the host computer.

The above example embodiments have been described hereinabove to illustrate various embodiments of implementing a system and method for providing self-optimized power management for DDR-compatible memory systems. Various modifications and departures from the disclosed example embodiments will occur to those having ordinary skill in the art. The subject matter that is intended to be within the scope of the invention is set forth in the following claims.

What is claimed is:

1. A memory module comprising:
   a plurality of memory components;
   an in-memory power manager; and
   an interface to a host computer over a memory bus;
   wherein the in-memory power manager is configured to control a transition of a power state of the memory module,
   wherein the power state of the memory module includes a low power down state, a normal power state, and a maximum power down state,
   wherein the low power down state includes a plurality of fine-grained low power down states,
   wherein the maximum power down state includes a plurality fine-grained maximum power down states,
   wherein the transition of the power state of the memory module includes a direct transition from any of the plurality of fine-grained low power down states of the low power down state to the maximum power down state,
   wherein the in-memory power manager can control a transition from a first fine-grained low power down state of the plurality fine-grained low power down states to a second fine-grained low power down state of the plurality fine-grained low power down states without going through intermediate fine-grained low power down states between the first and second fine-grained low power down states, and wherein the in-memory power manager can control a transition from a first fine-grained maximum power down state of the plurality fine-grained maximum power down states to a second fine-grained maximum power down state of the plurality fine-grained maximum power down states without going through intermediate fine-grained maximum power down states between the first and second fine-grained maximum power down states.

2. The memory module of claim 1, wherein the memory module is a double data rate (DDR)-compatible memory module.

3. The memory module of claim 1, wherein the host computer is configured to provide a host power command that overrides the transition of the power state of the memory module that is controlled by the in-memory power manager.

4. The memory module of claim 2, wherein the memory bus includes one or more repurposed pins for sending a status signal to the host computer.

5. The memory module of claim 1, wherein the in-memory power manager does not send a status signal to the host computer for the transition of the power state of the memory module between the plurality of fine-grained low power down states within the low power down state or between the plurality of fine-grained maximum power down states within the maximum power down state.

6. The memory module of claim 1, wherein the in-memory power manager includes an in-memory decision logic for determining a new power state and a time to transition to the new power state, and wherein the in-memory decision logic includes one or more of a timer, a predictor, and a machine-learning algorithm.

7. The memory module of claim 6, wherein the timer is configured to provide temporal information for power transition times using static or dynamic time limits.

8. The memory module of claim 6, wherein the predictor is configured to provide history-based activity predictors for the transition of the power state of the memory module.

9. The memory module of claim 6, wherein the machine learning algorithm is configured to learn optimize power states based on one or more of self-training, training examples, and trained data received from the host computer or another memory module.

10. The memory module of claim 6, wherein the in-memory power manager further includes a power state controller that is configured to control a transition of the power state of the memory module based on one or more of a decision provided by the in-memory decision logic and a host power command received from the host computer.

11. A method for providing an in-memory power transition, the method comprising:
providing an in-memory power manager in a memory module, wherein the memory module is coupled to a host computer over a memory bus;
determining an in-memory power management scheme at initialization of the memory module; and
controlling a transition of a power state of the memory module using the in-memory power manager,
wherein the power state of the memory module includes a low power down state, a normal power state, and a maximum power down state,
wherein the low power down state includes a plurality of fine-grained low power down states,
wherein the maximum power down state includes a plurality fine-grained maximum power down states,
wherein the transition of the power state of the memory module includes a direct transition from any of the plurality of fine-grained low power down states of the low power down state to the maximum power down state,
wherein the in-memory power manager can control a transition from a first fine-grained low power down state of the plurality fine-grained low power down states to a second fine-grained low power down state of the plurality fine-grained low power down states without going through intermediate fine-grained low power down states between the first and second fine-grained low power down states, and
wherein the in-memory power manager can control a transition from a first fine-grained maximum power down state of the plurality fine-grained maximum power down states to a second fine-grained maximum power down state of the plurality fine-grained maximum power down states without going through intermediate fine-grained maximum power down states between the first and second fine-grained maximum power down states.

12. The method of claim 11, wherein the memory module is a double data rate (DDR)-compatible memory module.

13. The method of claim 11, further comprising providing a host power command from the host computer that overrides the transition of the power state of the memory module that is controlled by the in-memory power manager.

14. The method of claim 12, further comprising sending a status signal to the host computer using one or more repurposed pins on the memory bus.

15. The method of claim 11, further comprising allowing the transition of the power state of the memory module between the plurality of fine-grained low power down states within the low power down state or between the plurality of fine-grained maximum power down states within the maximum power down state without sending a status signal to the host computer.

16. The method of claim 11, wherein the in-memory power manager includes an in-memory decision logic for determining a new power state and a time to transition to the new power state.

17. The method of claim 16, further comprising providing temporal information for power transition times using static or dynamic time limits using a timer of the in-memory decision logic.

18. The method of claim 16, further comprising providing history-based activity predictors for the transition of the power state of the memory module using a predictor of the in-memory decision logic.

19. The method of claim 16, further comprising learning optimize power states based on one or more of self-training, training examples, and trained data received from the host computer or another memory module.

20. The method of claim 16, further comprising transitioning the power state of the memory module based on one or more of a decision provided by the in-memory decision logic and a host power command received from the host computer.

* * * * *